(12) United States Patent
Maes

(10) Patent No.: US 10,186,534 B2
(45) Date of Patent: Jan. 22, 2019

(54) RADIATION-HARD MOS PIXEL SENSOR

(71) Applicant: TELEDYNE DALSA B.V., AE Eindhoven (NL)

(72) Inventor: Willem Hendrik Maes, Lommel (BE)

(73) Assignee: TELEDYNE DALSA B.V., Eindhoven (NL)

( * ) Notice: Subject to any disclaimer, the term of this patent is extended or adjusted under 35 U.S.C. 154(b) by 0 days.

(21) Appl. No.: 15/560,641

(22) PCT Filed: Apr. 30, 2015

(86) PCT No.: PCT/NL2015/050294
§ 371 (c)(1),
(2) Date: Sep. 22, 2017

(87) PCT Pub. No.: WO2016/175650
PCT Pub. Date: Nov. 3, 2016

(65) Prior Publication Data
US 2018/0090528 A1 Mar. 29, 2018

(51) Int. Cl.
*H01L 27/146* (2006.01)
*H01L 29/94* (2006.01)
(52) U.S. Cl.
CPC .. *H01L 27/14609* (2013.01); *H01L 27/14612* (2013.01); *H01L 27/14643* (2013.01); *H01L 27/14663* (2013.01); *H01L 29/94* (2013.01); *H01L 27/14689* (2013.01)
(58) Field of Classification Search
CPC ......... H01L 27/14609; H01L 27/14663; H01L 27/14612; H01L 27/14689; H01L 29/94
See application file for complete search history.

(56) References Cited

U.S. PATENT DOCUMENTS

| 6,069,376 | A | 5/2000 | Merrill |
| 2012/0256077 | A1 | 10/2012 | Yen et al. |
| 2012/0261549 | A1 | 10/2012 | Park et al. |
| 2018/0090528 | A1* | 3/2018 | Maes ................ H01L 27/14609 |

FOREIGN PATENT DOCUMENTS

| WO | WO 99/26408 A1 | 5/1999 |
| WO | WO 99/66560 A1 | 12/1999 |
| WO | WO 2008/106764 A1 | 9/2008 |

OTHER PUBLICATIONS

International Search Report for International Application No. PCT/NL2015/050294, dated Jan. 25, 2016.
Written Opinion of the International Searching Authority for International Application No. PCT/NL2015/050294, dated Jan. 25, 2016.

* cited by examiner

*Primary Examiner* — Mark Prenty
(74) *Attorney, Agent, or Firm* — K&L Gates LLP

(57) ABSTRACT

The present invention is related to a multi full-well pixel for a metal-oxide-semiconductor (MOS) active pixel image sensor. It is further related to a MOS active pixel image sensor comprising a plurality of such pixels. The invention is particularly related to active pixel image sensors realized in complementary MOS (CMOS) technology.
According to the invention, a MOS capacitor is used as a switchable capacitor, wherein the gate electrode is connected to the voltage that is to be read out. Semiconductor-side contacts of the MOS capacitor are used to apply a switching control signal that allows the effective capacitance of the MOS capacitor to be selected and being radiation-hard for damaging X-ray radiation.

21 Claims, 2 Drawing Sheets

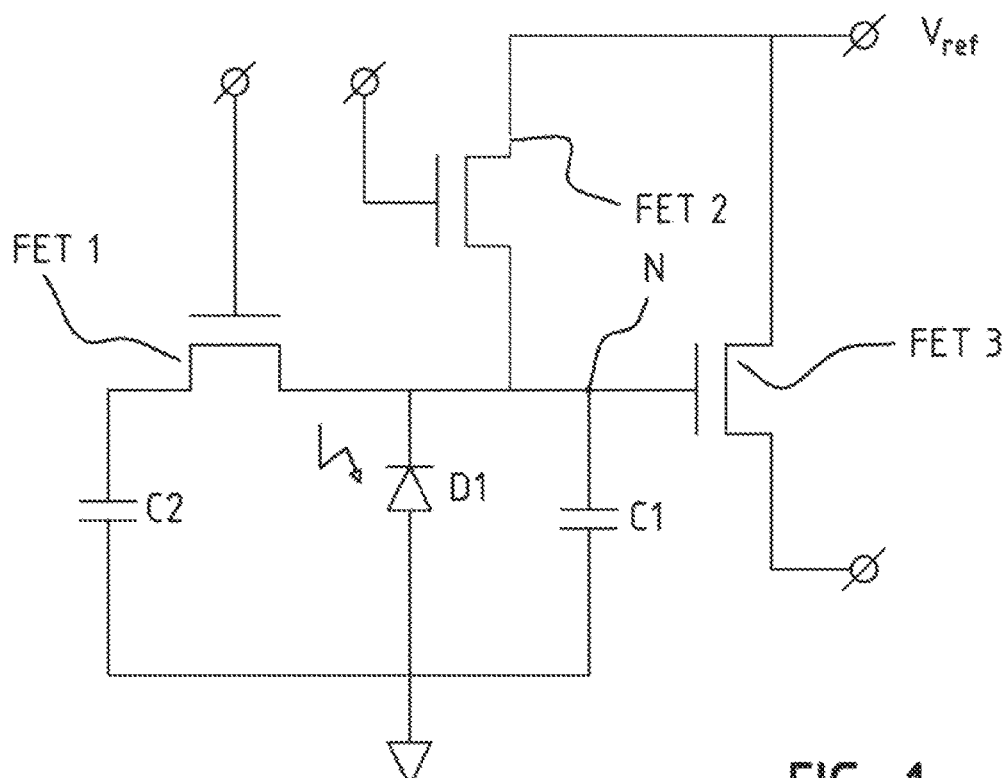
PRIOR ART        FIG. 1
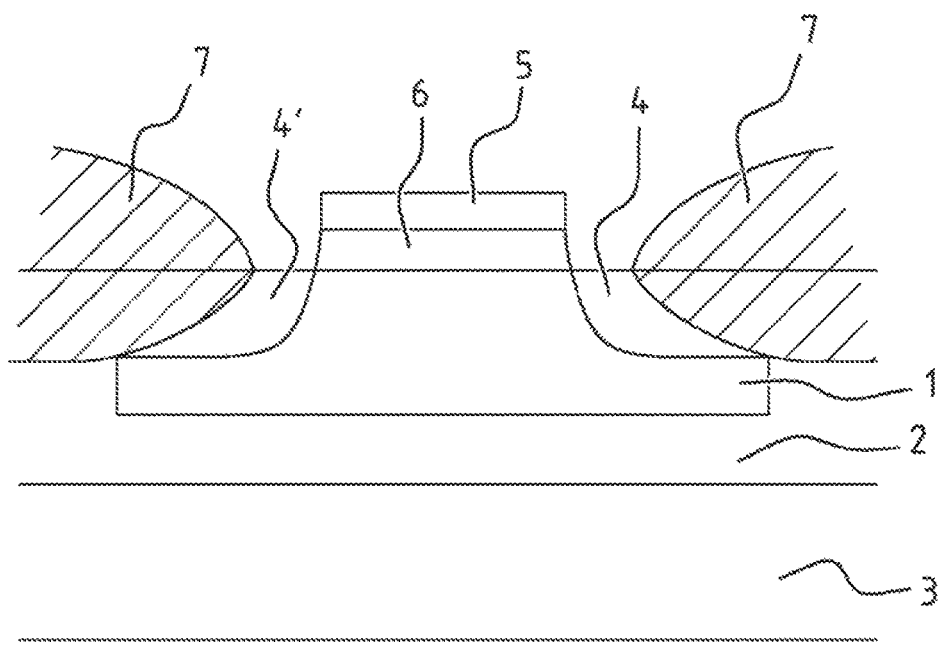
PRIOR ART        FIG. 2

RADIATION-HARD MOS PIXEL SENSOR

The present invention is related to a multi full-well pixel for a metal-oxide-semiconductor (MOS) active pixel image sensor. It is further related to a MOS active pixel image sensor comprising a plurality of such pixels. The invention is particularly related to active pixel image sensors realized in complementary MOS (CMOS) technology.

The use of CMOS active pixel image sensors for detecting X-rays in medical applications is known in the art. These sensors comprise an array of pixels, wherein each pixel comprises a photodiode. A scintillator layer is typically used to convert the X-ray to light having a wavelength for which the photodiode has a high sensitivity.

FIG. 1 illustrates a known dual full-well pixel. It comprises a photodiode D1 that is connected to a first storage capacitor C1 and to a second storage capacitor C2 via a switching MOS field effect transistor (FET), designated as FET1. A reset MOSFET, designated as FET2, is used to reset the voltage at node N. Furthermore, a source follower MOSFET, designated as FET3, is used to output the voltage at node N to read-out circuitry (not shown).

The operation cycle of the pixel is described next. Here, it will be assumed that FET1 is in the conductive state, as a result of which C1 and C2 are connected in parallel to form a total capacitance Ctot=C1+C2.

As a first step, the voltage across Ctot, i.e. the voltage at node N, is reset by setting FET2 in the conductive state. Next, FET2 is set in the non-conductive state. Incoming X-ray radiation will be converted to green light by the scintillator. This light will impinge on photodiode D1, thereby generating a photocurrent that will discharge Ctot.

After a predetermined amount of time, hereinafter referred to as integration time, the voltage at node N is read, via FET3, using known active matrix based read-out circuitry.

The voltage that has been read is indicative for the amount of X-ray radiation that fell onto the pixel during the integration time. However, this voltage is susceptible to process spreading, for instance a spreading in the threshold voltage Vt of the various FETs. To solve this problem, a double integration method can be used in which the voltage at node N is set, after which it is directly read out, i.e. essentially without having being affected by incoming radiation. The difference in voltage between this so-called dark value and the earlier mentioned read-out voltage provides a better indication for the incoming X-ray radiation.

The size of Ctot determines the maximum amount of X-ray radiation that can be detected without saturation. More in particular, when the voltage at node N becomes too low, it can no longer be read out using the read-out circuitry. As such, the voltage at node N for which a reliable measurement can be performed ranges from Vlim up to the voltage directly after reset, wherein Vlim is typically around 1 Volt, depending on the read-out circuitry used.

If a low amount of X-ray radiation is to be expected, FET1 can be put in the non-conductive state. The total storage capacitor can then be approximated by Ctot=C1. This allows the pixel to operate in a low saturation level mode, in which only C1 is used, and a high saturation level mode, in which both C1 and C2 are used. This further allows a balance to be found between the impact of thermal noise attributed to the first and possibly second storage capacitor, the so-called kTC noise, the amount of X-ray radiation to be expected, and the integration time.

A drawback of using a switching FET is related to the fact that the gate capacitance of such FET contributes to the total capacitance. Any noise on the switching signal is therefore coupled to the voltage at node N when the FET is in its conductive state.

X-ray radiation that has penetrated through the scintillator layer may damage the underlying CMOS circuitry. For instance, leakage currents may be generated, or traps may be generated inside the band-gap of the Silicon, which traps provide leakage paths inside the pixel circuitry. These leakage currents build-up during the life-time of the detector and can be significantly higher than the intrinsic silicon leakage current sources without X-ray radiation.

The CMOS process may use several known techniques to isolate active areas from each other. For instance, the active area for an n-channel MOSFET and the active area for a p-channel MOSFET may be electrically isolated using shallow trench isolation (STI) or a thermally-generated field oxide (LOCOS). In both techniques, the active areas are isolated by means of a non-conductive oxide, hereinafter referred to as isolation oxide.

It is known that X-ray radiation may generate traps at the interface between the isolation oxide and the Silicon. These traps may have a detrimental effect on the performance of the pixel as will be elucidated next.

FIG. 2 presents a schematic cross section of FET1. In this figure, an n-channel MOSFET is depicted. This FET is realized in a p-well 1 formed in a p-type epitaxial layer 2 that has been grown on a p-type Silicon wafer 3. It should be noted that FET1 may equally be formed directly in p-type epitaxial layer 2 in order to achieve a low threshold voltage. Highly doped n-type regions 4, 4' are formed for the drain and source contact of the FET, respectively. The gate contact 5 is formed on top of a gate oxide 6.

FET1 has its drain contact connected to node N and its source contact to C2. The gate is connected to a driver that applies either a high voltage or a low voltage, depending on whether the FET1 should be put in the conductive or non-conductive state, respectively.

It can be seen from FIG. 2 that an isolation oxide 7 (LOCOS) is present near highly doped regions 4, 4'. Hence, regardless of the conductive state of FET1, when a leakage current is generated at the isolation oxide—Silicon interface near highly doped region 4, a leakage current may flow to C1. Such current will, similar to the photocurrent from D1, discharge C1 thereby disturbing the measurement of the X-ray radiation.

A known method to lower the radiation sensitivity of FETs is to use a circular geometry. Circular FETs have either their source or drain enclosed by the gate. In this geometry, a thick isolation oxide is only used on the radially most outer contact. If such FET is used as FET1 in FIG. 2, with the radially most inner contact connected to C1, it can be achieved that the isolation oxide leakage currents do not influence the detection of X-ray radiation when FET1 is in the non-conductive state. In this state, currents generated at the contact connected to C2 cannot reach C1 as the FET is in its non-conductive state. However, when FET1 is in the conductive state, such current may flow to C1 and/or C2, thereby impacting the detection of the X-ray radiation.

The problem of preventing the impact of leakage currents on the sensor performance is important for dual full-well or multi full-well pixels as these pixels require the use of one or more switching FETs.

It is therefore an object of the present invention to provide a multi full-well pixel in which the abovementioned problems do not occur or at least to a lesser extent. Within the context of the present invention, a multi full-well pixel comprises at least two storage capacitors, of which at least one is switchable.

According to the invention, this object has been achieved using a multi full-well pixel for a metal-oxide-semiconductor MOS active pixel image sensor that comprises a photodiode, a first capacitor that is electrically connected to the photodiode, and a second capacitor. A total capacitance that is electrically connected to the photodiode can be changed in dependence of a switching signal from a switching signal source.

According to the invention, the second capacitor comprises a metal-oxide-semiconductor (MOS) capacitor having a metal-side contact and a semiconductor-side contact, wherein the metal-side contact is electrically connected to the photodiode, and wherein the semiconductor-side contact is connectable to the switching signal source.

Unlike the prior art, the pixel according to the present invention does not use a switching FET. Instead, a MOS capacitor is used. Such capacitor comprises an oxide arranged on a semiconductor, and a metal, or other conductive material such as poly-Si, placed on top of the oxide. By applying a voltage difference between the semiconductor and the metal, charge concentration directly underneath the oxide can be influenced.

For instance, for a MOS capacitor on a p-type layer, applying a voltage to the metal on top of the oxide with respect to the semiconductor may result in the charge distribution underneath the oxide to correspond to a) an accumulation condition, wherein more holes are present near the oxide-semiconductor interface than in the bulk of the semiconductor layer, b) a flat-band condition, wherein the amount of holes corresponds to the amount in the bulk of the semiconductor layer, c) a depletion condition, wherein the amount of holes is significantly less than in the bulk, and d) an inversion condition, wherein the amount of electrons is larger than the amount of holes near the oxide-semiconductor interface.

The applicant has realized that by adding a semiconductor-side contact, the MOS capacitor can be used as the second storage capacitor. The voltage that determines the condition in which the MOS capacitor operates is determined by the potential at the metal-side contact, which is determined by the voltage at the first storage capacitor or the voltage at node N, the potential at the semiconductor-side contact, which is determined by the switching signal applied using the switching signal source, and the potential of the bulk substrate. Typically, the bulk substrate is electrically grounded.

When the switching signal is high, a depletion condition can be achieved and a low capacitance value is obtained. On the other hand, when the switching signal is low, an inversion condition can be achieved and high capacitance value can be obtained.

Leakage current will be drained by the switching signal source. Consequently, according to the invention, the leakage current problem attributed to isolation oxide-semiconductor interface traps can be obviated. Furthermore, the impact of noise on the switching signal on the voltage that is read out is marginal. Typically, the switching signal source is able to provide a relatively stable low ground potential. A high potential, possibly with added noise, is provided to achieve a low capacitance. Consequently, the capacitive coupling of the noisy switching signal to the outputted signal will be limited.

In an embodiment, the MOS capacitor is configured to change between a low capacitance state and a high capacitance state in dependence of the switching signal. Moreover, the MOS capacitor may comprise a stack of a conductor layer, an oxide layer, and a semiconductor layer, wherein the MOS capacitor is configured to change between the low and high capacitance states depending on whether inversion, depletion, or accumulation occurs in the semiconductor layer directly underneath the oxide layer of the MOS capacitor in dependence of the switching signal.

In an embodiment, the semiconductor-side contact is formed in the semiconductor layer laterally adjacent to the oxide layer and/or conductor layer. The semiconductor layer may have a first doping level of a first charge type, and the semiconductor-side contact formed in the semiconductor layer may have a second doping level of a second charge type opposite to the first charge type. The first doping level may be lower than the second doping level. For instance, the first doping level may be below $1\times10^{15}$ cm$^{-3}$, and more preferably below $1\times10^{14}$ cm$^{-3}$. The second doping level may be higher than $1\times10^{20}$ cm$^{-3}$. As an example, the semiconductor layer may be p-type doped, and the terminal may be n-type doped.

It should be apparent to the skilled person that the semiconductor-side contact may be electrically connected to one or more metal or conductive layers to allow the switching signal source to be connected. Furthermore, the semiconductor-side contact may be formed on opposing sides with respect to the oxide layer and/or conductor layer.

In an embodiment, the MOS capacitor may be formed by a metal-oxide-semiconductor field-effect transistor (MOSFET) gate capacitor of a MOS technology process used for the fabrication of the MOS active pixel image sensor. In another or further embodiment, the semiconductor-side contact may be formed by a drain or source implanting region of a MOS technology process used for the fabrication of the MOS active pixel image sensor. The MOS technology preferably comprises a CMOS technology In an embodiment, the first capacitor may comprise a MOS capacitor and/or the first capacitor may be formed by the internal capacitance of the photodiode.

In an embodiment, the photodiode may comprise a first terminal and a second terminal, wherein the second terminal is electrically connected to ground, and wherein the first terminal is electrically connected to the first capacitor and to the metal-side contact of the second capacitor. Moreover, the pixel may comprise a buffer unit for buffering a voltage at the first terminal, wherein the buffer unit is preferably formed by a MOSFET source follower. The pixel may comprise a reset unit for resetting the voltage at the first terminal to a predefined voltage, wherein the reset unit preferably comprises a MOSFET switch connectable to a voltage source.

In an embodiment, the pixel comprises at least one additional capacitor which is arranged parallel to and configured as the second capacitor. The semiconductor-side contact of this additional capacitor is preferably connectable to a switching signal source separate from the switching signal source for the second capacitor. For example, a pixel may be formed using three storage capacitors C1-C3, wherein the following combinations can be made C1, C1+C2, C1+C3, C1+C2+C3. Again, C1 is typically much smaller than either C2 or C3.

In an embodiment, the pixel comprises a scintillator layer for converting incoming X-ray radiation into visible light.

The present invention further provides a metal-oxide-semiconductor (MOS) active pixel image sensor comprising a plurality of pixels as defined above.

Next, exemplary embodiments of the invention will be described in detail referring to the appended drawings, wherein similar reference signs have been used to refer to similar or identical parts, and wherein:

FIG. 1 illustrates a known pixel layout;

FIG. 2 illustrates a cross section of an n-channel MOSFET used in the pixel of FIG. 1;

FIG. 3 illustrates an embodiment of a dual full-well pixel in accordance with the present invention. It resembles the pixel illustrated in FIG. 1 with the exception of the second storage capacitor C_mos of which a cross section is shown in FIG. 4.

Figure 3:
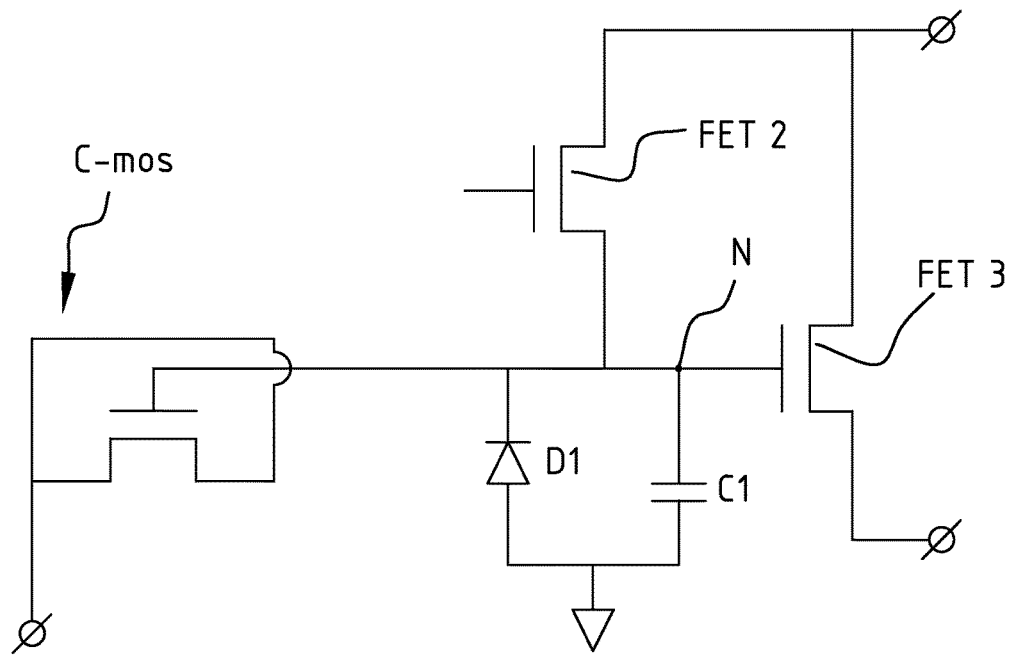
FIG. 3 illustrates an example of a pixel layout in accordance with the present invention.
Figure 4:
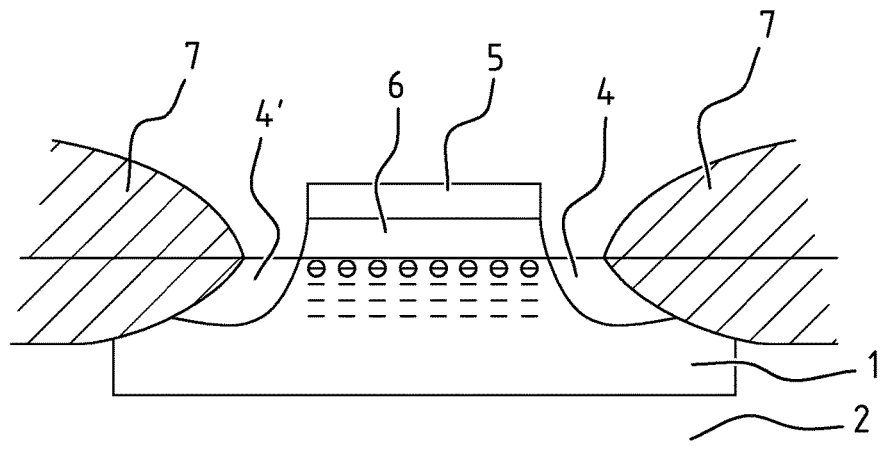
FIG. 4 illustrates an example of a MOS capacitor used in the pixel of FIG. 3 when a low voltage is applied.

FIG. 4 illustrates an embodiment of a MOS capacitor that can be used as the second storage capacitor. It corresponds to the n-channel MOSFET depicted in FIG. 2 with the exception that the drain and source contacts are electrically connected to each other to operate as a single counter-electrode to the gate electrode. The gate electrode is connected to node N. The drain and source contacts are electrically connected to a switching signal source (not shown). In practice, the drain and source contact essentially form a single contact.

FIG. 4 further illustrates a charge distribution in the semiconductor layer directly under the gate oxide when a low voltage, e.g. 0V, is applied to the drain and source contacts. Because the capacitor is formed in a low Vt process, e.g. Vt=−0.2V, applying only a small positive voltage to the gate electrode with respect to the grounded substrate and with respect to the drain and source contacts will result in the formation of a thin charge inversion layer directly underneath the oxide layer, indicated by the encircled minus signs. In addition, a depletion layer, indicated by the non-encircled minus signs, will exist in the epitaxial layer that extends towards the substrate. This depletion layer comprises negatively charged acceptor ions as the positive voltage at the gate electrode has pushed away the holes that are normally associated with these acceptor ions. The combined negative charge in the thin inversion layer and the negative charge in the depletion region must equal the positive charge in the gate electrode.

Typically, the background doping in the epitaxial layer is in the order of $1\times10^{14}$ cm$^{-3}$, whereas the doping level in the drain and source implant regions is in the order of $1\times10^{20}$ cm$^{-3}$. Due to the low background doping, most of the negative charge will reside in the thin inversion layer directly underneath the gate oxide. As a result, the effective capacitance Ceff, being determined by the distance between the relevant charges, can be approximated by the oxide capacitance Cox (per unit area):

$$Ceff = Cox = \frac{diel1}{t}$$

wherein t is the thickness of the gate oxide and diel1 its dielectric constant. When the voltage in the drain and source contacts is increased, electrons in the inversion layer will be attracted by the higher potential and will, at a given voltage, be effectively removed from the previously formed inversion layer. What remains are the negatively charged acceptor ions. The effective capacitance in this situation is much less than Cox. Instead, the effective capacitance can be approximated by:

$$\frac{1}{Ceff} = \frac{1}{Cox} + \frac{1}{Cdepl}$$

wherein Cdepl is the depletion capacitance per unit area which can be approximated by:

$$Cdepl = \frac{diel2}{W}$$

wherein W is the thickness of the depletion layer and diel2 the dielectric constant of the epitaxial layer. Due to the low background doping, the depletion region will extend downwards to the substrate over a considerable length, thereby lowering Cdepl and Ceff. Depending on the doping concentrations used, a ratio Cox/Cdepl in a range from 10 to 100 may be obtained. The depletion capacitance depends on the voltage applied to the gate contact due to the fact that W varies with the gate voltage. It should be apparent to the skilled person that Cdepl should preferably be much less than C1.

During operation, the voltage at node N will generally vary between Vref and 0V, and more preferably between Vref and Vlim, where Vlim is the lowest voltage that can be read-out reliably. Hence, directly after resetting the voltage at node N, the gate voltage at the second storage capacitor will equal Vref, which typically is about 3V. Being a low Vt process, applying Vref to the source and drain contacts of C2 will sufficiently remove the electrons from a possible inversion layer. A depletion layer with sufficient depth will be obtained to lower the effective capacitance. This depletion layer will be maintained when the gate voltage is lowered during the integration time.

If a low voltage is applied to the drain and source contacts, e.g. 0V, a large voltage difference will be present over the gate oxide during the entire integration time. An inversion layer will therefore exist regardless of the voltage at node N. This may even apply for the situation when the voltage at node N equals 0V due to the low Vt process used.

Any leakage current generated at the interface between the isolation oxide and the epitaxial layer will be removed to the switching signal source and/or to the grounded substrate. Unlike the prior art, there is no direct electrical connection between the source of the leakage currents and node N. Due to the fixed potential applied to this node, all generated leakage currents at this node are withdrawn from the node and sunk into the applied voltage source.

Although the present invention has been explained using embodiments thereof, it should be apparent that these embodiments may be modified without departing from the scope of the invention which is defined by the appended claims and their equivalents.

The invention claimed is:

1. A multi full-well pixel for a metal-oxide-semiconductor (MOS) active pixel image sensor, comprising:
   a photodiode;
   a first capacitor electrically connected to the photodiode;
   a second capacitor;
   wherein a total capacitance that is electrically connected to the photodiode can be changed in dependence of a switching signal from a switching signal source;

characterized in that the second capacitor comprises a metal-oxide-semiconductor (MOS) capacitor having a metal-side contact and a semiconductor-side contact, wherein the metal-side contact is electrically connected to the photodiode and wherein the semiconductor-side contact is connectable to the switching signal source.

2. The pixel according to claim 1, wherein the MOS capacitor is configured to change between a low capacitance state and a high capacitance state in dependence of the switching signal.

3. The pixel according to claim 2, wherein the MOS capacitor comprises a stack of a conductor layer, an oxide layer, and a semiconductor layer, wherein the MOS capacitor is configured to change between said low and high capacitance states depending on whether inversion, depletion, or accumulation occurs in the semiconductor layer directly underneath the oxide layer of the MOS capacitor in dependence of the switching signal.

4. The pixel according to claim 3, wherein the semiconductor-side contact is formed in the semiconductor layer laterally adjacent to the oxide layer.

5. The pixel according to claim 4, wherein the semiconductor layer has a first doping level of a first charge type, and wherein the semiconductor-side contact formed in the semiconductor layer has a second doping level of a second charge type opposite to the first charge type.

6. The pixel according to claim 5, wherein the first doping level is lower than the second doping level.

7. The pixel according to claim 6, wherein the first doping level is below $1 \times 10^{15}$ cm$^{-3}$.

8. The pixel according to claim 5, wherein the semiconductor layer is p-type doped, and wherein the terminal is n-type doped.

9. The pixel according to claim 1, wherein the MOS capacitor is formed by a metal-oxide-semiconductor field-effect transistor (MOSFET) gate capacitor of a MOS technology process used for the fabrication of the MOS active pixel image sensor.

10. The pixel according to claim 1, wherein the first capacitor comprises a MOS capacitor or wherein the first capacitor is formed by the internal capacitance of the photodiode.

11. The pixel according to claim 1, wherein the photodiode comprises a first terminal and a second terminal, wherein the second terminal is electrically connected to ground, and wherein the first terminal is electrically connected to the first capacitor and to the metal-side contact of the second capacitor.

12. The pixel according to claim 11, wherein the pixel comprises a buffer unit for buffering a voltage at the first terminal.

13. The pixel according to claim 1, further comprising at least one additional capacitor which is arranged parallel to and configured as said second capacitor, wherein the semiconductor-side contact of said additional capacitor is connectable to a switching signal source separate from the switching signal source for the second capacitor.

14. The pixel according to claim 1, further comprising a scintillator layer for converting incoming X-ray radiation into visible light.

15. A metal-oxide-semiconductor (MOS) active pixel image sensor comprising a plurality of pixels as in claim 1.

16. The pixel according to claim 6, wherein the first doping level is below 1×1014 cm-3.

17. The pixel according to claim 6, wherein the semiconductor layer is p-type doped, and wherein the terminal is n-type doped.

18. The pixel according to claim 1, wherein the semiconductor-side contact is formed by a drain or source implanting region of a MOS technology process used for the fabrication of the MOS active pixel image sensor.

19. The pixel according to claim 11, wherein the pixel comprises a reset unit for resetting the voltage at the first terminal to a predefined voltage, wherein said reset unit comprises a MOSFET switch connectable to a voltage source.

20. The pixel according to claim 12, wherein said buffer unit is formed by a MOSFET source follower.

21. The pixel according to claim 19, wherein said reset unit comprises a MOSFET switch connectable to a voltage source.

* * * * *